United States Patent [19]
Burns et al.

[11] Patent Number: 5,721,503
[45] Date of Patent: Feb. 24, 1998

[54] FLASH ANALOG-TO-DIGITAL CONVERTER WITH LATCHING EXCLUSIVE OR GATES

[75] Inventors: Lawrence M. Burns, Mountain View; William E. Stanchina, Thousand Oaks, both of Calif.

[73] Assignee: Hughes Aircraft Company

[21] Appl. No.: 329,565

[22] Filed: Oct. 26, 1994

[51] Int. Cl.$^6$ .............................. H03K 5/24; H03K 3/315
[52] U.S. Cl. .................. 327/199; 327/78; 327/195; 327/570; 326/52
[58] Field of Search .................. 327/65, 68, 71, 327/77, 89, 78, 195, 570, 200, 201, 198, 199, 560–563, 64, 74–76; 326/52, 53, 55

[56] References Cited

U.S. PATENT DOCUMENTS

| | | | |
|---|---|---|---|
| 4,999,528 | 3/1991 | Keech | 327/198 |
| 5,140,188 | 8/1992 | Burns | 307/362 |
| 5,221,866 | 6/1993 | Takatsu | 327/199 |
| 5,347,175 | 9/1994 | Laug et al. | 327/77 |

OTHER PUBLICATIONS

Corcoran et al., "A 400MHz 6b ADC", *IEEE International Solid–State Circuit Conference*, Feb. 24, 1984, pp. 294–296.
van de Grift et al., "An 8b 50MHz Video ADC with Folding and Interpolation Techniques", *IEEE International Solid–State Circuits Conference*, 1987, pp. 94, 95, 354.
Van de Plassche, "An 8–bit 100MHz Full Nyquist Analog–to–Digital Converter", *IEEE Journal of Solid State Circuits*, vol. 23, No. 6, Dec. 1988, pp. 1334–1344.

*Primary Examiner*—Timothy P. Callahan
*Assistant Examiner*—Eunja Shin
*Attorney, Agent, or Firm*—V. D. Duraiswamy; W. K. Denson-Low

[57] ABSTRACT

The number of input latching comparators in a flash analog-to-digital converter is significantly reduced by merging the input latching function into exclusive OR gates used in the converter's decoding section. A latching exclusive OR gate used for this purpose employs resonant tunneling diodes as the latching devices, with hysteresis and impedance elements connected to ensure that the gate latches in a logic state that corresponds to the input analog signal. The latching logic gates operate in a current mode, enabling updated logic states to be latched in response to a periodic clock signal.

12 Claims, 5 Drawing Sheets

FIG. 3a.
(PRIOR ART)

|   | A | B | C | R15 | R16 | Y | Ȳ |
|---|---|---|---|-----|-----|---|---|
| 1 | 0 | 0 | 0 | 2I1 | I1  | 0 | 1 |
| 2 | 0 | 0 | 1 | I1  | 2I1 | 1 | 0 |
| 3 | 0 | 1 | 0 | —   | —   | - | - |
| 4 | 0 | 1 | 1 | 2I1 | I1  | 0 | 1 |
| 5 | 1 | 0 | 0 | —   | —   | - | - |
| 6 | 1 | 0 | 1 | —   | —   | - | - |
| 7 | 1 | 1 | 0 | —   | —   | - | - |
| 8 | 1 | 1 | 1 | I1  | 2I1 | 1 | 0 |

FIG. 3b.
(PRIOR ART)

|    | A | B | C | D | E | R15 | R16 | Y | Ȳ |
|----|---|---|---|---|---|-----|-----|---|---|
| 1  | 0 | 0 | 0 | 0 | 0 | 3I1 | 2I1 | 0 | 1 |
| 2  | 0 | 0 | 0 | 0 | 1 | 2I1 | 3I1 | 1 | 0 |
| 3  | 0 | 0 | 0 | 1 | 0 | —   | —   | - | - |
| 4  | 0 | 0 | 0 | 1 | 1 | 3I1 | 2I1 | 0 | 1 |
| 5  | 0 | 0 | 1 | 0 | 0 | —   | —   | - | - |
| 6  | 0 | 0 | 1 | 0 | 1 | —   | —   | - | - |
| 7  | 0 | 0 | 1 | 1 | 0 | —   | —   | - | - |
| 8  | 0 | 0 | 1 | 1 | 1 | 2I1 | 3I1 | 1 | 0 |
| 9  | 0 | 1 | 0 | 0 | 0 | —   | —   | - | - |
| 10 | 0 | 1 | 0 | 0 | 1 | —   | —   | - | - |
| 11 | 0 | 1 | 0 | 1 | 0 | —   | —   | - | - |
| 12 | 0 | 1 | 0 | 1 | 1 | —   | —   | - | - |
| 13 | 0 | 1 | 1 | 0 | 0 | —   | —   | - | - |
| 14 | 0 | 1 | 1 | 0 | 1 | —   | —   | - | - |
| 15 | 0 | 1 | 1 | 1 | 0 | —   | —   | - | - |
| 16 | 0 | 1 | 1 | 1 | 1 | 3I1 | 2I1 | 0 | 1 |
| 17 | 1 | 0 | 0 | 0 | 0 | —   | —   | - | - |
| ⋮  |   |   |   |   |   |     |     |   |   |
| 31 | 1 | 1 | 1 | 1 | 0 | —   | —   | - | - |
| 32 | 1 | 1 | 1 | 1 | 1 | 2I1 | 3I1 | 1 | 0 |

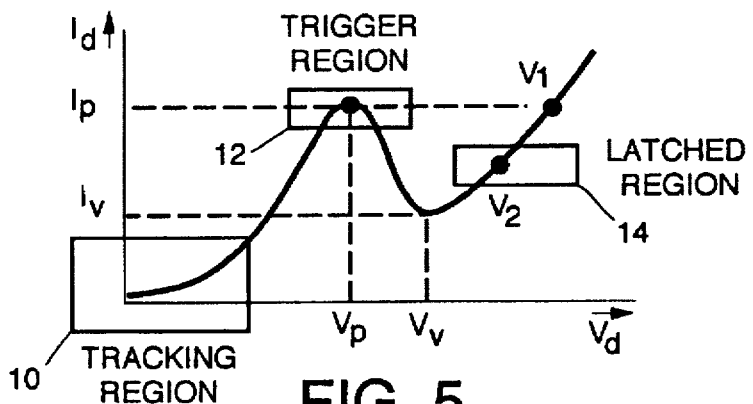
FIG. 5.
FIG. 6.
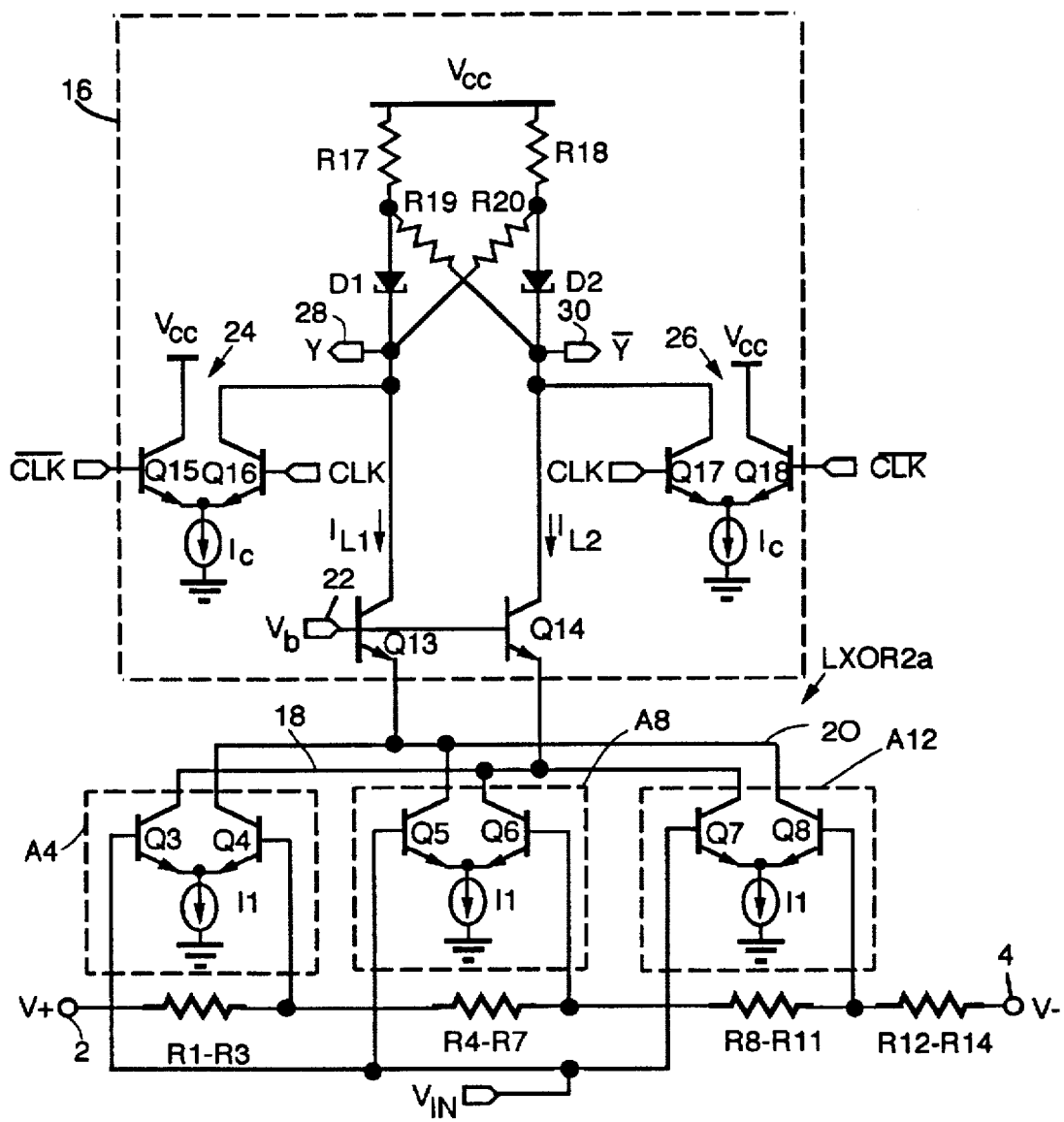

FLASH ANALOG-TO-DIGITAL CONVERTER WITH LATCHING EXCLUSIVE OR GATES

This invention was made with Government support under F33615-90-C-1496 awarded by the Department of the Air Force. The Government has certain rights in this invention.

BACKGROUND OF THE INVENTION

1. Field of the Invention

This invention relates to analog-to-digital converters (ADCs), and more particularly to exclusive OR (XOR) gates and latch circuits used in flash ADCs.

2. Description of the Related Art

Flash ADCs take their name from their high conversion speed. They employ a precision voltage reference that is divided by a precision resistor divider to provide individual comparator reference voltages. As the input voltage increases the comparators switch in turn, and a decode logic network provides an appropriate digital output as a function of the state of the comparator input voltages. On a typical n-bit flash ADC, $2^{n-1}$ comparators and $2^{n-1}$ corresponding resistor taps must generally be used. An 8-bit converter would require, for example, 255 comparators and 255 resistor taps.

FIG. 1 is a block diagram of a conventional 4-bit ADC. A resistor string consisting of fourteen series resistors R1–R14 is connected between positive and negative voltage reference terminals 2 and 4. Fifteen input preamplifiers A1–A15 are provided, with each preamp inverting input receiving its input from a respective tap off the resistor string. The non-inverting preamp inputs are all connected to an input terminal 6 to receive an analog input signal that is to be converted to digital format. The output of each preamp A1–A15 is connected to a respective latching comparator, L1–L15, with a clock input 8 connected to each of the latching comparators and periodically causing them to latch the output of their respective preamps.

As the analog input signal at terminal 6 swings from its full negative to its full positive excursion, the outputs from each of the preamps toggle from 0 to 1 in turn, beginning with A15 for the most negative and progressing through A1 for the most positive input. The resultant set of digital preamp outputs is referred to as a thermometer code. With this code format, if the output of a given preamp is a logic 1, then the outputs from all of the preamps of lower bit order (vertically below the on preamp in FIG. 1) are also logic 1s.

Contingent upon the presence of a thermometer code format, the ADC's decoding logic can be greatly simplified by using a "gray-code" decoding scheme. This type of decoding logic uses XOR gates whose operation is based upon current summations. For the 4-bit ADC of FIG. 1, 7 XOR gates XOR1–XOR7 are interconnected with each other in a known fashion to produce a 4-bit digital output that is captured by four corresponding output latches L16–L19. The first rank of four XOR gates XOR1–XOR4 are current mode (CM) devices that receive thermometer code inputs from respective sets of latches L1–L15. The second and third ranks, consisting respectively of XOR5, XOR6 and of XOR7, are voltage mode (VM) devices that receive inputs from the preceding rank; their inputs do not have to be in a thermometer code format. Operating under the control of the clock input 8, the output latches yield the 4-bit digital output designated as bits B1–B4.

A limiting amplifier buffer BFR1 converts the sine wave clock signal to a square wave suitable for controlling the digital circuitry. Three more buffers BFR2, BFR3 and BFR4 in series with BFR1 provide gate delays to synchronize the clock signal at the output latches L16–L19 with the logic signals that propagate through three ranks of XOR gates. Additional buffers BFR5–BFR10 provide gate delays for connections between the decode network and the output latches that bypass one of more ranks of XOR gates.

FIG. 2 shows a current mode XOR gate that has been used in the decoding section of the FIG. 1 ADC. The gate is illustrated as having either three or five inputs. It includes a pair of resistors R15, R16 that are connected between a positive voltage bus Vcc (typically +5 volts) and the current (collector-emitter) circuits of a pair of matched npn bipolar transistors Q1, Q2. Both transistors are biased into conduction by a common bias signal Vb. The gate outputs Y and $\overline{Y}$, corresponding to logic 1 and logic 0 outputs, are taken respectively from the R15/Q1 and the R16/Q2 junctions.

The gate inputs are supplied by respective differential transistor pairs, each of which correspond to a respective preamplifier of FIG. 1. For a three input device, in which the inputs are designated A, B and C, the most significant bit (MSB) input consists of differentially connected bipolar transistors Q3, Q4 that are biased respectively by input A and the complement of A ($\overline{A}$). Their emitters are connected in common to a current source I1, while their collectors are connected to draw current from the current circuits of Q2 and Q1, respectively. The other input differential pairs have similar designs. The second MSB input comprises transistors Q5, Q6 and another I1 current source, while the least significant bit (LSB) input consists of differentially connected transistors Q7, Q8 and another current source I1. The inputs B and C are applied to the bases of Q5 and Q7, with complementary input signals $\overline{B}$ and $\overline{C}$ applied to the bases of Q6 and Q8, respectively. The insertion of Q1 and Q2 between R15, R16 and differential pairs Q3–Q8 allows for a higher speed operation than would be the case if the resistors were connected directly to Q3–Q8.

The connections of the differential input pairs to the transistors Q1, Q2 alternates from pair to pair. That is, whereas the differential transistors for A and $\overline{A}$ (Q3 and Q4) are connected respectively to the collectors of Q2 and Q1, the differential transistors for B and $\overline{B}$ (Q5 and Q6) are connected respectively to the collectors of Q1 and Q2, and the third differential transistor pair again alternates so that the input transistors for C and $\overline{C}$ (Q7 and Q8) are connected respectively to the collectors of Q2 and Q1, the same as for the MSB input pair.

The response of the 3-input XOR to thermometer code inputs is illustrated in the truth table of FIG. 3a. First assume that the inputs A, B and C are all at a logic 0 level (with the complementary inputs $\overline{A}$, $\overline{B}$ and $\overline{C}$ at a logic 1 level). This is indicated on line 1 of FIG. 3a. With this input pattern, the transistors Q3, Q5 and Q7 are held OFF, while transistors Q4, Q6 and Q8 are ON. Thus, two units of current (2I1) flow through R15, and one unit of current (I1) flows through R16. With R15 and R16 having equal resistance values, this produces a voltage drop across R15 that is twice the voltage drop across R16. Subtracting these voltage drops from Vcc yields a higher voltage for output $\overline{Y}$ than for output Y; the output Y is accordingly a logic zero and its complement $\overline{Y}$ is a logic one.

If the LSB input C now goes high, as indicated on line 2 of FIG. 3a, transistor Q7 turns ON and Q8 turns OFF, and one unit of current is shifted from R15 to R16. This results in a lower voltage drop across R15 than R16, and consequently a logic 1 Y output.

The next higher input pattern, illustrated on line 3, is for input B to be high and the other inputs A and C low. However, such an input pattern violates the thermometer code pattern and accordingly no outputs from the XOR gate are given, as indicated by dashes through the $I_{R15}$, $I_{R16}$, Y and $\overline{Y}$ columns for this nonallowable state. The next higher input pattern, with B and C high and A low, is consistent with the thermometer code. As illustrated on line 4, this input pattern shifts one unit of current from R16 back to R15 (because of Q5 turning ON and Q6 OFF). The result is that output Y is a logic 0, while the complementary output $\overline{Y}$ is a logic 1.

The next three input patterns in progressively higher binary order, shown on lines 5–7, all violate the thermometer code pattern. The final possible input pattern, shown on line 8, is for all three inputs A, B and C to be logic 1. In this event one unit of current is shifted from R15 to R16 (compared to the line 4 pattern), with the Y output a logic 1 and the complementary $\overline{Y}$ output a logic 0.

It can be seen from an inspection of FIG. 3a that, for a gray-code input, the Y output is a logic 1 when an odd number of inputs are high, and a logic 0 when an even number of inputs are high. This satisfies the basic definition of the XOR function.

FIG. 3b presents a truth table for a five input XOR gate. In this case new differential transistor pairs Q9, Q10 and Q11, Q12, of lower bit significance than the other transistor pairs and with respective base inputs D, $\overline{D}$ and E, $\overline{E}$, have been added to the three input case. Continuing the alternating pattern of connections, Q9 and Q10 are connected to draw current from R15 and R16, while the collectors of Q11 and Q12 are connected to draw current from R16 and R15, respectively. Three units of current (3I1) are drawn through R15 and two units (2I1) through R16 for thermometer code input patterns in which an even number of inputs are high, while two units of current are drawn through R15 and three units through R16 for thermometer code input patterns in which an odd number of inputs are high. This again satisfies the basic XOR function.

A thermometer code XOR gate requires an odd number of inputs in addition to the gray-code. If an even number of inputs is desired, the gate is implemented with the next higher odd number of inputs, and one of the inputs is forced to a constant logic 0 state. This is illustrated in FIG. 2 by replacing the Q11, Q12 transistor pair with a current source I1 that is connected directly between the R15/Q1 circuit and ground, as indicated by dashed line 9. An equivalent truth table for this gate with four effective inputs can be obtained from FIG. 3b by considering only those lines in the table for which column E is a logic 0 and the remaining columns A–D follow a thermometer code pattern.

ADCs of the type illustrated in FIG. 1 have a fairly high level of complexity and are not well adapted to the continual need for greater resolution (i.e., more bits) and higher conversion rates. To increase the operating range, the same number of circuit elements have to work at higher and higher speeds. For resolutions above 8 or 10 bits, more than one monolithic integrated circuit is usually required, and both cost and power consumption are relatively high.

Other types of ADCs have been explored in recent years, in particular folding/interpolation devices in which a certain degree of ADC decoding is performed on the analog signal prior to its being latched. Input currents are summed together and differential voltages are produced across resistor pairs, with the voltages latched by standard latching comparators. A performance limitation of the folding/ interpolation approach is that each amplifier's output changes polarity multiple times as the input signal goes from its lowest to its higher value. This effectively increases the amplifier's output frequency. Since such amplifiers are limited in bandwidth, the output signal amplitude falls off at higher frequencies and their analog input bandwidth suffers compared to conventional flash ADCs. Folding/interpolation devices are disclosed, for example, in Corcoran et al., "A 400 MHz 6b ADC", *IEEE International Solid-State Circuit Conference*, Feb. 24, 1984, pages 294–296; van de Grift et al., "An 8b 50 MHz Video ADC with Folding and Interpolation Techniques", *IEEE International Solid-State Circuits Conference*, 1987, pages 94, 95, 354; and Van de Plassche, "An 8-bit 100-MHz Full Nyquist Analog-to-Digital Converter", *IEEE Journal of Solid State Circuits*, Vol. 23, No. 6, Dec. 1988, pages 1334–1344.

SUMMARY OF THE INVENTION

The present invention seeks to provide an improved ADC with a simplified structure that requires fewer circuit elements, and yet is capable of greater resolution at higher speeds than previously obtainable, and an associated latching XOR design that is incorporated into the ADC to achieve these goals.

The new ADC eliminates the need for a separate latch for each input preamp, and instead incorporates differential current driven latching circuits into a smaller number of logic gates in the decoding section. The latching function incorporated into the logic gates requires an equivalent amount of circuit area per latch as the prior separate input latches, but the reduction in the total number of latches both simplifies the circuit and improves its conversion rate performance.

The latching portions of the latching XOR gates preferably employ resonant tunneling diodes that have higher and lower voltage regions of positive electrical impedance, separated by a region of negative electrical impedance. A pair of hysteresis elements, preferably resistors, maintain each of the latching devices in their higher voltage regions of positive impedance when they are triggered, at a lower voltage than the initial higher voltage trigger level. A pair of impedance elements, also preferably resistors, cross-couple the input and output sides of the latching devices so that one device is latched in its high voltage state while it diverts current away from the non-latched device to prevent it from triggering.

The latching circuits are operated in a current mode, with a control circuit providing control currents to the latching devices that rise over non-zero rise times in response to a LATCH signal and add to the differential logic currents from the XOR portion of the gate. The differential logic currents vary between high and low logic values; the full value of the control current when added to the high logic current level is sufficient to trigger the associated latching device, which in turn causes the other latching device to be held off. The control currents are produced in response to a periodic clock signal that causes the circuit to acquire new input analog samples on the positive edge of each clock pulse at the clock rate.

These and other features and advantages of the invention will be apparent to those skilled in the art from the following detailed description, taken together with the accompanying drawings.

BRIEF DESCRIPTION OF THE DRAWINGS

FIGS. 3a and 3b are truth tables for three and five input gray-coded XOR gates, described above;

FIG. 5 is a graph illustrating the voltage-current characteristic of a typical resonant tunneling diode and its application to the invention; and FIG. 6 is a schematic diagram of a new latching XOR gate used in the invention.

DETAILED DESCRIPTION OF THE INVENTION

Figure 4:
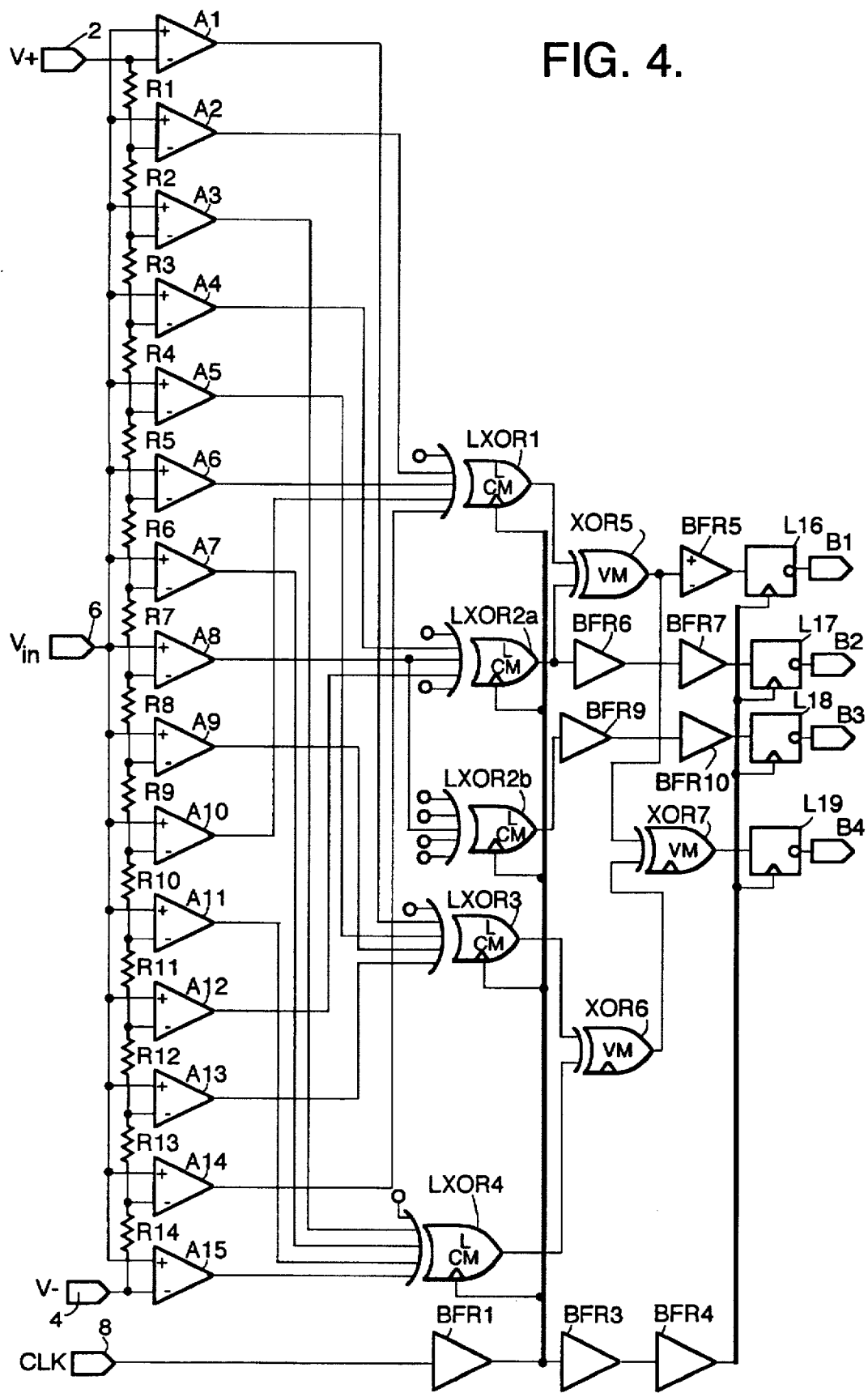
FIG. 4 is a block diagram of a flash ADC in accordance with the invention.

A block diagram of a 4-bit ADC that uses the invention is shown in FIG. 4. The invention is applicable to other digital input resolutions, and in fact its benefits increase as the number of input bits goes up, but a 4-bit device is shown for purposes of illustration to avoid unnecessary complexity.

Figure 1:
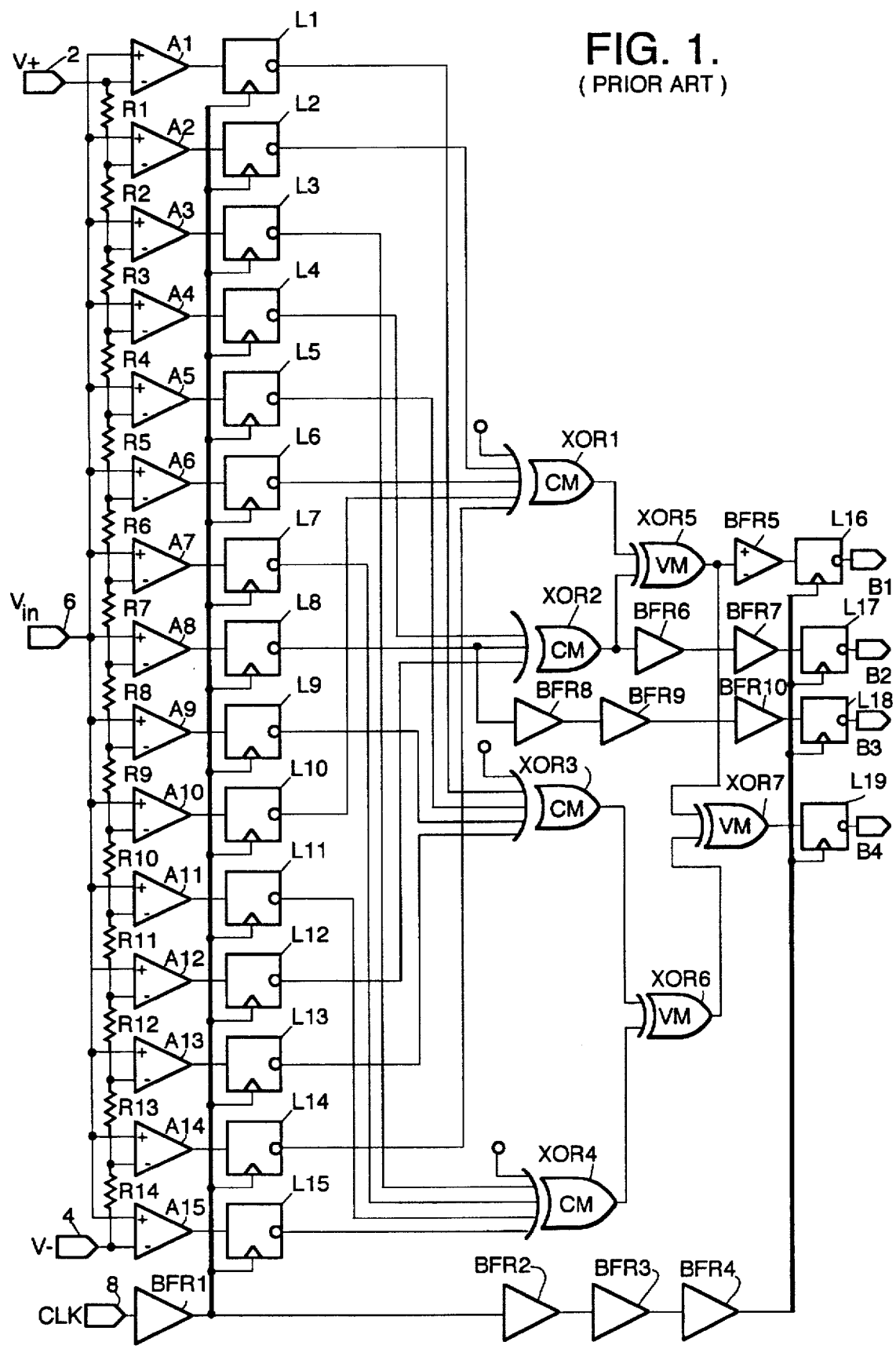
FIG. 1 is a block diagram of a conventional flash ADC topology, described above.

The new ADC of FIG. 4 is similar in certain ways to the prior ADC of FIG. 1, and equivalent elements are indicated by the same reference numbers in both figures. The new FIG. 4 circuit also uses 15 input preamps A1–A15, with one input of each preamp tapped off a resistor string R1–R14, and the other input connected to receive an analog signal applied to input terminal 6. The FIG. 4 circuit also employs the same output latches L16–L19 as in FIG. 1.

Instead of the fifteen separate input latches L1–L15 used in FIG. 1, the input latching function is incorporated into modified XOR gates, in the first rank of the decoding section, which are designated LXOR1–LXOR4 to indicate that they perform both latching and XOR functions. The latching XOR gates LXOR1–LXOR4 are connected with the remaining non-latching XOR gates XOR5–XOR7 in essentially the same Gray-Code decoding scheme as the XOR gates of FIG. 1. However, by incorporating the latching function into the first rank of XOR gates, the number of input latching circuits used is reduced from fifteen to five.

In place of the four XOR gates used in the first rank of the FIG. 1 decode section, in FIG. 4 two latching gates LXOR2a and LXOR2b are used in place of the single XOR2 gate, resulting in five LXOR gates for the first rank. This is for delay matching purposes, so that the outputs from the first rank of decode logic are all latched and presented to the second rank at the same time. LXOR2b, which receives only a single variable logic input, in effect acts as a latching buffer; it replaces the non-latching buffer BFR8 of FIG. 1.

The preferred latching circuit incorporated into each of the LXOR gates is based upon a circuit disclosed in U.S. Pat. No. 5,140,188 to Burns (one of the present inventors) and assigned to Hughes Aircraft Company, the assignee of the present invention, but the latching function is controlled in a different manner. This circuit uses a resonant tunneling diode, the voltage-current characteristic of which is illustrated in FIG. 5. The voltage and current initially increase together in a low voltage region of positive impedance until a peak voltage Vp and peak current Ip are reached. As the voltage continues to increase, the device enters a region of negative impedance in which the current progressively decreases until a minimum (valley) current Iv is reached at a voltage Vv. Thereafter the current increases exponentially with voltage in a high voltage region of positive impedance. A tunneling device has very small parasitic capacitance levels and therefore requires very small amounts of charging or discharging, with a corresponding potential for a much faster operation than a more conventional switching device.

Other devices that also exhibit a region of negative impedance between high and low voltage regions of positive impedance include programmable unijunction transistors, 4-layer pnpn optoelectronic devices used in differential optical switching, and a double heterostructure optoelectronic switch with the acronym DOES. These types of devices are referenced in U.S. Pat. No. 5,140,188, and can also be used for the present invention.

The manner in which a resonant tunneling diode or similar acting device is used in the invention is also illustrated in FIG. 5. The illustrated application is for a differential current driven latch in which the current division between two tunnel diodes is governed by a differential current supplied by an XOR gate. During a TRACK phase, the currents through both tunnel diodes are supplied by the XOR portion of the gate and kept at relatively low levels within the "tracking region" 10 illustrated in the figure. The connection to the XOR portion of the gate causes the currents through the two diodes to differ, depending upon the input analog signal. When a clock signal is applied to switch the circuit to the LATCH mode, bias current is added to both diodes that brings the higher current diode slightly above Ip, while leaving the current through the other diode slightly below Ip. This brings the higher current diode within the "trigger region" 12 illustrated in the figure. Upon triggering, the higher current diode jumps from Vp to V1 in the higher voltage region of positive impedance, retaining the same current Ip. This transition occurs extremely rapidly, due to the quantum tunneling effect.

To prevent the triggered diode from retriggering or perhaps oscillating, a hysteresis element is added to the circuit that causes the voltage across the triggered diode to drop down to V2 within the "latched region" 14, below Ip but above Iv. Since the diode current excursions from the XOR portion of the gate are considerably less than the applied bias current, the current through the triggered diode cannot fall below Iv; the diode therefore latches in a stable triggered state. Furthermore, a cross-coupling circuit described below reduces the current through the non-triggered tunnel diode in response to the positive voltage jump for the triggered diode. This causes the non-triggered device to latch at an operating point below the trigger region 12, so that fluctuations in the current from the XOR circuit cannot thereafter raise its current high enough to trigger. The circuit is thus latched in a stable state, with one tunnel diode held triggered and the other non-triggered, regardless of the changing currents received from the XOR circuit due to the varying input analog signal. The circuit remains in this latched state until it is reset to a TRACK mode by removing the clock signal, at which time the current in the triggered device falls back below Iv until the next clock signal is applied.

A circuit that combines this type of latch with a XOR operation to provide the LXOR function of FIG. 4 is shown in FIG. 6. Two tunnel diodes D1 and D2 have their input sides connected respectively through resistors R17 and R18 to a positive voltage bus Vcc. The input and output sides of D1 and D2 are cross-coupled by a pair of resistors R19 and R20.

To understand the operation of the latch, assume that the current through D1 increases above the trigger level Ip, while the current through D2 remains below Ip. This causes D1 to trigger and jump from voltage level Vp to V1. Since R17 and D1 are connected in series, they function as a voltage divider so that the increase in voltage across D1 produces a corresponding reduction in the voltage across R17. This reduces the current through R17, and thus through D1, causing D1 to settle within the latched region 14 of FIG.

5 at a somewhat lower level of voltage and current. R17 and R18 thus function as hysteresis elements that cause the triggered diode to enter the stable latched region 14. The reduction in the R17–D1 current means that, to maintain a constant current from this branch of the circuit, additional current must be provided from the positive voltage bus Vcc through R18 and the cross-coupling resistor R20. The current through R20, which increases the voltage drop across R20, is diverted away from diode D2, thus reducing the D2 current so that D2 operates in an area safely below the trigger region 12 of FIG. 5. The reduction in current to D20 causes a compensating current to be drawn through R17 and R19. This in turn further reduces the current through D1, and thus D2, with the two diodes settling within securely latched operating regions; the triggered diode remains triggered, and the other diode is prevented from triggering.

In FIG. 6 the latching portion of the LXOR gate is enclosed within a dashed box 16. The complementary LXOR outputs Y and $\overline{Y}$ are taken from the cathodes of D1 and D2, respectively.

Figure 2:
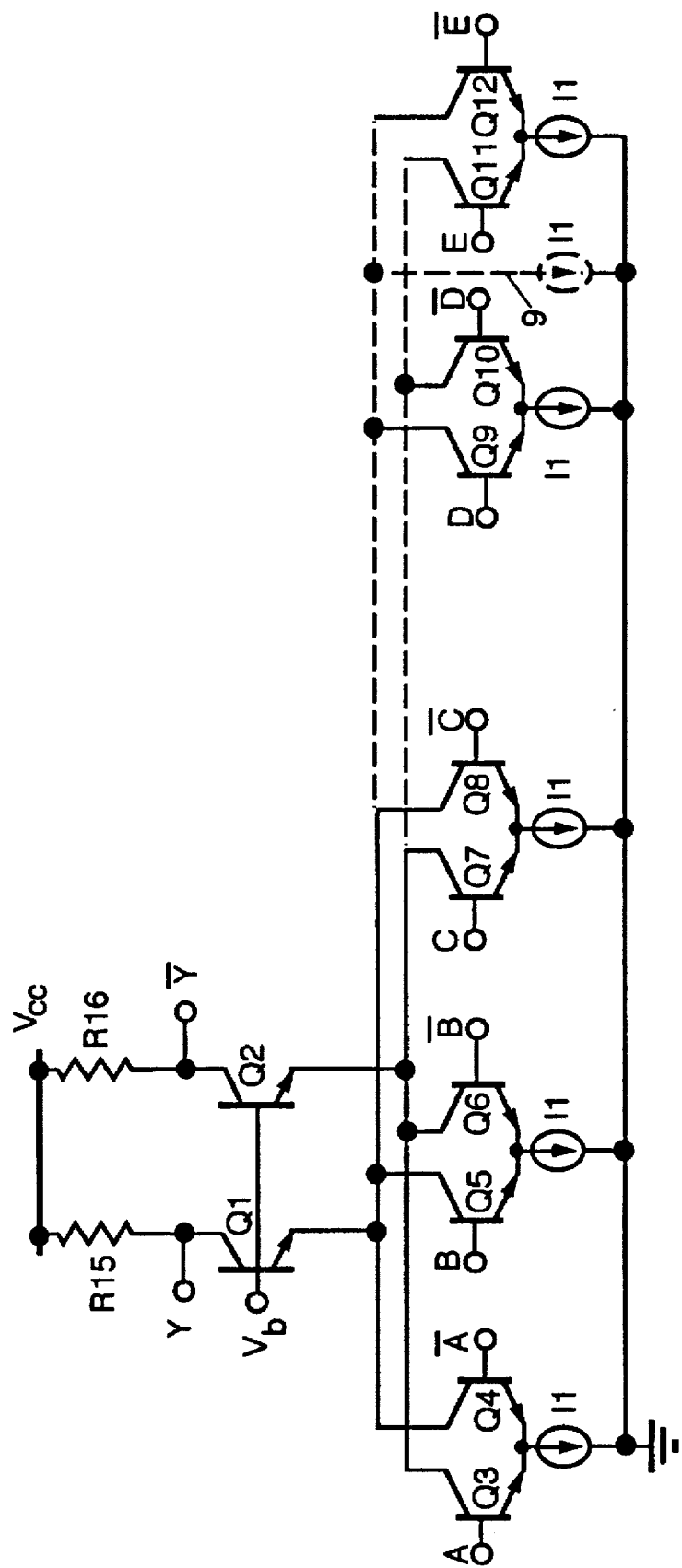
FIG. 2 is a schematic diagram of a conventional gray-coded XOR gate, described above.

For purposes of illustration, assume that the FIG. 6 LXOR gate is LXOR2a from FIG. 4. Current inputs to the latch are provided from the XOR portion of the circuit, in which the preamps A4, A8 and A12 are connected together as an XOR. These preamps are shown as the same differential current transistors pairs Q3–Q8 and current sources I1 as in the FIG. 2 XOR. As shown in FIG. 4, resistors R1–R3 are connected in series between the V+ terminal 2 and the inverting input (Q4) of preamp A4; resistors R4–R7 are connected between the inverting inputs (Q4, Q6) of preamp A4 and A8; resistors R8–R11 are connected between the inverting inputs (Q6, Q8) of preamps A8 and A12; and resistors R12–R14 are connected between the inverting input of A12 and the V– terminal 4. The input analog signal is applied via terminal 6 to the non-inverting inputs of A4, A8 and A12 (respectively Q3, Q5 and Q7).

Current sources I1 are connected between the emitters of each preamp transistor pair and ground. To establish an XOR output for the thermometer code input, the non-inverting transistors in A4 and A12 (Q3 and Q7) have their collectors connected together with the collector of the inverting transistor in A8 (Q6) on line 18, while the collectors of the inverting transistors in A4 and A12 (Q4 and Q8) are connected together with the collector of the non-inverting transistor in A8 (Q5) on line 20. To fully implement the 5-input LXOR2a of FIG. 4, two additional I1 current sources (not shown) would be connected directly to output line 18.

The XOR gate provides a current drive to the latch circuit through the collector-emitter circuits of bipolar transistors Q13 and Q14, which are connected to provide current to XOR output lines 20 and 18, respectively. The two transistors are held conductive by a common bias voltage Vb at a bias terminal 22 that is connected to the bases of both devices. Q13 and Q14 provide low impedance nodes at their emitters for summing the currents from Q3–Q8.

The LXOR is latched with either a high or a low output when a clock signal is present, and then reset to an unlatched state during the half of the timing cycle when the clock signal is absent. For this purpose, a pair of latch control circuits 24 and 26 draw equal bias control currents Ic from the D1 and D2 branches of the latch circuit, respectively, when a clock signal (CLK) is present, and remove this current from the latch circuit during the absence of a clock signal ($\overline{CLK}$). Control circuit 24 is implemented as a differential transistor pair Q15, Q16 supplied by a current source Ic at the transistor emitters. A $\overline{CLK}$ control input is applied to the base of Q15, whose collector is connected to Vcc; a CLK input is applied to the base of Q16, whose collector is connected to draw current from the D1 branch of the latch circuit. Control circuit 26 has a similar differential pair design, with transistor Q17 drawing a current of Ic from the D2 branch of the latch circuit in response to a CLK signal at its base, and transistor Q18 supplying the Ic current source from Vcc in response to a $\overline{CLK}$ control input.

The current magnitudes flowing through Q13 and Q14 into lines 20 and 18, respectively, are determined by the input analog signal Vin; these currents are designated logic currents $I_{L1}$ and $I_{L2}$ in FIG. 6. When Vin is less than the base voltage of Q8 and preamp A12, all of the preamps will have a logic low current output. Thus, currents equal to I1 will be drawn through both transistors Q3 and Q7 from line 18, and a single I1 current will be drawn through Q5 from line 20. $I_{L1}$ will thus be equal to I1, while $I_{L2}$ will be equal to 2 I1. As the input voltage Vin sweeps upward to change the logic states of preamps A12, A8 and A4 in sequence, the current values of $I_{L1}$ and $I_{L2}$ will alternately toggle between I1 and 2I1.

The current through D1 at any given time is the sum of Ic and $I_{L1}$, while the current through D2 is the sum of Ic and $I_{L2}$. The values of Ic and I1 are selected so that, taking into account the finite rise time of Ic, the higher of the two diode currents will rise to a value that exceeds Ip. This causes the higher current diode to latch in a conductive state, while the other diode remains non-conductive. The LXOR circuit outputs Y and $\overline{Y}$ are taken from terminals 28 and 30 at the cathodes of D1 and D2, respectively. When $I_{L1}$ is greater than $I_{L2}$, diode D1 triggers and the voltage across R17/D1 increases to a level greater than the voltage drop across R18/D2. The $\overline{Y}$ output thus goes high, and the Y output low. The logic output is reversed when $I_{L2}$ is greater than $I_{L1}$, in which case output Y goes high and output $\overline{Y}$ goes low.

Suitable values for I1, Iv, Ip and Ic can be established by starting with a current value for I1. Assuming I1 is 500 mA, Iv must be greater than 2I1 during $\overline{CLK}$ to allow a previously latched diode to turn off and the latch circuit to reset before latching again. Selecting diodes with Iv equal to 1.25 mA provides a 25% margin (safety factor). Because of the inherent diode characteristic, Ip=3Iv, or 3.75 mA. Once Ip is known, Ic can be selected based upon the requirement that Ip must be no greater than the sum of Ic and the greater of $I_{L1}$ or $I_{L2}$. The worst case is when the differential inputs to Q3/Q4 or Q7/Q8 are exactly equal, so that $I_{L1}=I_{L2}=1.5I1$ (the average value of $I_{L1}$ and $I_{L2}$). For this case, the sum of Ic and 1.5I1 must be at least equal to Ip. Therefore, Ic must be at least 3 mA. Applying the same 25% margin as for Iv, Ic is 3.75 mA.

Towards the end of a TRACK ($\overline{CLK}$) cycle, just before the beginning of the next LATCH (CLK) cycle, $I_{L1}$ flows through D1 and $I_{L2}$ flows through D2. Then, at the beginning of the LATCH cycle, Ic will begin to ramp up through both D1 and D2 (the Ic rise time is typically about 25–50 psec). Thus, the current through D1 will reach Ip before the current through D2 does if $I_{L1}$ is greater than $I_{L2}$, and vice versa if $I_{L2}$ is greater than $I_{L1}$. The diode whose current reaches Ip first triggers and is latched ON, while the other diode is latched OFF as described previously. This holds true even if the sum of Ic and the lesser of $I_{L1}$ and $I_{L2}$ for the non-triggered diode exceeds Ip, since the Ic component through the non-triggered diode does not have a chance to build up to the full value of Ic before the other diode triggers to latch the non-triggered diode OFF.

While an illustrative embodiment of the invention has been shown and described, numerous variations and alternate embodiments will occur to those skilled in the art. Such variations and alternate embodiments are contemplated, and can be made without departing from the spirit and scope of the invention as defined in the appended claims.

We claim:

1. A latching circuit, comprising:

a pair of latching devices characterized by higher and lower voltage regions of positive electrical impedance separated by negative electrical impedance, said latching devices triggering from their lower to their higher voltage regions of positive impedance in response to their currents exceeding a trigger level, said devices being at respective initial higher voltage region trigger voltages when triggered, and having respective input and output sides, a pair of hysteresis elements connected in circuit with said latching devices for maintaining said devices when triggered in their higher voltage regions of positive impedance at a lower voltage than their respective initial higher voltage region trigger voltages, a pair of impedance elements cross-coupling the input and output sides of said latching devices for enabling one latching device to be latched in its higher voltage region of positive impedance while diverting current away from the non-latching device, thereby preventing the non-triggering latching device from latching in its high voltage region of positive impedance, a bias current circuit connected to induce equal bias currents to rise in said latching devices over a non-zero rise time in response to a LATCH signal, an actuating current circuit connected to supply an actuating current to a selectable one of said latching devices, said actuating current by itself being less than said trigger level but together with the full value of one of said bias current being at least as great as said trigger level, so that the selected latching device is triggered in response to a LATCH signal when the sum of its actuating current and its bias current reaches said trigger level, and a coupling circuit connected between said actuating current circuit and said bias current circuit which couples said actuating current to said latching devices, said coupling circuit providing a low impedance node to said actuating current.

2. The latching circuit of claim 1, wherein said actuating current circuit is connected to supply a non-actuating current to the non-selected latching device which is less than said actuating current.

3. The latching circuit of claim 2, where the level of said actuating current is substantially twice the level of said non-actuating current.

4. The latching circuit of claim 1, wherein said latching devices comprise resonant tunneling diodes and said hysteresis elements comprise impedances connected in series with their respective latching devices.

5. A latching exclusive OR circuit, comprising:

a pair of latching devices characterized by higher and lower voltage regions of positive electrical impedance separated by negative electrical impedance, said latching devices triggering from their lower to their higher voltage regions of positive impedance in response to their currents exceeding a trigger level, said devices being at respective initial higher voltage region trigger voltages when triggered, and having respective input and output sides, a pair of hysteresis elements connected in circuit with said latching devices for maintaining said devices when triggered in their higher voltage regions of positive impedance at a lower voltage than their respective initial higher voltage region trigger voltages, a pair of impedance elements cross-coupling the input and output sides of said latching devices for enabling one latching device to be latched in its higher voltage region of positive impedance while diverting current away from the non-latching device, thereby preventing the non-triggering latching device from latching it its high voltage region of positive impedance, a plurality of ordered two-branch logic cells with respective current sources and differential current outputs, a reference circuit providing respective ordered reference signals to one branch of each logic cell, and input node connected to apply an input signal to a second branch of each logic cell, said logic cells steering the currents from their respective current sources between their respective branches in accordance with their respective reference signals relative to said input signal, a first output current line connected to accumulate currents from first branches of each of said ordered logic cells that sequentially alternate between said first and second branches from cell to cell, a second output current line connected to accumulate currents from the other branches of said ordered logic cells, the connection of said output current lines to said logic cells following an exclusive OR pattern such that one of said output current lines accumulates an actuating current level and the other output current line accumulates a non-actuating current level in response to a true exclusive OR input signal pattern to said logic cells relative to said reference signals, and said one output current line accumulates a non-actuating current level and said other output current line accumulates an actuating current level in response to a false exclusive OR input signal pattern, a bias current circuit connected to induce equal bias currents to rise in said latching devices over a non-zero rise time in response to a LATCH signal, the full value of said bias currents when added to said actuating current level exceeding said trigger level and causing the latching device to which the actuating current is coupled to latch, and a current coupling circuit connected between said logic cells and said bias current circuit which couples the currents of said output current lines to respective latching devices, said coupling circuit providing a low impedance node to said logic cells.

6. The latching exclusive OR circuit of claim 5, wherein said actuating current level is substantially twice said non-actuating current level.

7. The latching exclusive OR circuit of claim 5, wherein said reference circuit comprises a series-impedance voltage divider circuit, with the reference signals for said logic cells tapped from successive impedances of said voltage divider circuit.

8. The latching exclusive OR circuit of claim 5, said current coupling circuit comprising a pair of matched transistors having respective current and control circuits, with the currents of said output current lines coupled to their respective latching devices through the current circuits of respective transistors, and said transistor control circuits connected to a common control bias.

9. The latching exclusive OR circuit of claim 8, wherein said transistors comprise NPN heterojunction bipolar transistors and said latching devices comprise resonant tunneling diodes.

10. The latching exclusive OR circuit of claim 5, wherein said latching devices comprise resonant tunneling diodes and said hysteresis elements comprise impedances connected in series with their respective latching devices.

11. The latching circuit of claim 1, wherein said bias current circuit comprises two matching current sources for inducing said equal bias currents in said latching devices.

12. The latching exclusive OR circuit of claim 5, wherein said bias current circuit comprises two matching current sources for inducing said equal bias currents in said latching devices.

* * * * *